(12) United States Patent
Uenishi

(10) Patent No.: US 6,784,499 B2
(45) Date of Patent: Aug. 31, 2004

(54) SEMICONDUCTOR DEVICE SERVING AS A PROTECTING ELEMENT

(75) Inventor: Akio Uenishi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/603,772

(22) Filed: Jun. 26, 2003

(65) Prior Publication Data

US 2004/0145022 A1 Jul. 29, 2004

(30) Foreign Application Priority Data

Jan. 28, 2003 (JP) .................................... P2003-018555

(51) Int. Cl.[7] .............................................. H01L 23/62
(52) U.S. Cl. ...................... 257/362; 257/566; 257/579
(58) Field of Search .............................. 257/362, 566, 257/579

(56) References Cited

U.S. PATENT DOCUMENTS

| | | | |
|---|---|---|---|
| 4,994,874 A | * | 2/1991 | Shimizu et al. ............. 257/362 |
| 5,223,737 A | | 6/1993 | Canclini |
| 5,334,886 A | * | 8/1994 | Chuang ........................ 326/126 |
| 5,452,171 A | * | 9/1995 | Metz et al. .................... 361/56 |
| 5,471,082 A | | 11/1995 | Maeda |
| 5,780,905 A | * | 7/1998 | Chen et al. .................. 257/355 |
| 5,789,785 A | | 8/1998 | Ravanelli et al. |
| 6,635,930 B1 | * | 10/2003 | Hauptmann et al. ......... 257/355 |

FOREIGN PATENT DOCUMENTS

| | | | |
|---|---|---|---|
| EP | 0803955 A2 | * 10/1997 | ............ H02H/9/04 |
| JP | 62-69678 | 3/1987 | |
| JP | 5-48007 | 2/1993 | |
| JP | 7-193153 | 7/1995 | |
| JP | 8-321588 | 1/1996 | |

* cited by examiner

Primary Examiner—Allan R. Wilson
(74) Attorney, Agent, or Firm—Oblon, Spivak, McClelland, Maier & Neustadt, P.C.

(57) ABSTRACT

The protecting element includes an NPN transistor having an emitter connected to an input/output terminal and a collector and a base connected to a ground terminal. The input/output terminal has the possibility of receiving a surge voltage. The input/output terminal, which may be referred to as a pad, is connected to a semiconductor integrated circuit IC to be protected against the surge voltage. The arrangement of the semiconductor integrated circuit IC is not limited to a specific one.

11 Claims, 16 Drawing Sheets

SEMICONDUCTOR DEVICE SERVING AS A PROTECTING ELEMENT

BACKGROUND OF THE INVENTION

1. Field of the Invention

The present invention relates to a semiconductor device, and more particularly to a semiconductor device serving as a protecting element for protecting a semiconductor integrated circuit against surge voltage, i.e., electrostatic discharge (referred to as ESD).

2. Description of the Background Art

As a protecting element for protecting a semiconductor integrated circuit against surge voltage (i.e., ESD), it is conventionally known that an avalanche diode is interposed between an input/output terminal and a ground terminal.

For example, Japanese Patent Application Laid-open No. 548007 (1993), column 4 and FIG. 2, discloses an avalanche diode serving as an ESD protecting device which has a cathode connected to an input/output terminal side and an anode connected to the ground.

The above conventional circuit arrangement causes a breakdown of the avalanche diode when a surge voltage having positive (i.e., plus) polarity is applied to the input/output terminal, thereby absorbing the surge voltage and preventing the semiconductor integrated circuit which is connected to the input/output terminal from being broken.

The above arrangement is for a conventional ESD protecting mechanism. When a surge voltage enters into the input/output terminal, the avalanche diode needs to surely cause a breakdown so that the voltage level decreases down to a safe zone for internal elements of the semiconductor integrated circuit. To this end, a serial resistance component of the avalanche diode must be set to several ohms. However, the avalanche diode has a large internal resistance and accordingly a large area is required.

Furthermore, it may be possible to employ a thyristor element in addition to the avalanche diode. However, if the current continuously flows even after the thyristor element latches in response to the surge voltage, the thyristor will continuously turn on. Such a circuit arrangement cannot be applied to an output protecting circuit or a comparable circuit having lower circuit impedance.

Considering the recent trends that semiconductor integrated circuits are required to realize reduction of power consumption and downsizing, it is not preferable to employ the above-described conventional protecting element because of its large internal resistance and the required large area which lead to increase of costs. This conventional protecting element does not suit for an output protecting circuit or a comparable circuit having lower circuit impedance.

SUMMARY OF THE INVENTION

It is therefore an object of the present invention to provide a semiconductor device which is capable of assuring sufficient durability, in cost evaluation, against surge voltage when it is applied to a semiconductor integrated circuit which is compact in size and low in power consumption or applied to a semiconductor integrated circuit which is non-expensive.

To accomplish the above and other related objects, the present invention provides a first semiconductor device interposed between an input/output terminal and a ground terminal of a semiconductor integrated circuit, and serving as a protecting element for protecting the semiconductor integrated circuit against electrostatic discharge. The first semiconductor device includes an emitter electrode provided on a first main surface of a semiconductor substrate. A P-type base region is disposed in a surface of the first main surface and containing P-type impurities. An N-type emitter region, selectively disposed in a surface of the P-type base region, contains N-type impurities at a relatively higher concentration, and contacts with the emitter electrode. A base contact region is selectively disposed in a surface of the P-type base region, and is spaced from the N-type emitter region with a spatial clearance. The base contact region contains P-type impurities at a relatively higher concentration. A base electrode is disposed on the base contact region. An N-type collector region, disposed in a surface of the second main surface, contains N-type impurities at a relatively higher concentration and electrically contacts with a collector electrode. The emitter electrode is connected to the input/output terminal.

The base electrode and the collector electrode are connected to the ground potential. A main current flows in the direction normal to the main surface of the semiconductor substrate. This means that a vertical NPN transistor is used as a protecting element for protecting the semiconductor integrated circuit. The surge voltage can be suppressed. Temperature rise of the protecting element can be limited to a low level.

Furthermore, when the terminal current exceeds a predetermined value, the base-collector junction becomes a forward bias. The conductivity modulation will appear in an N-type collector region having a lower purity concentration. The resistance component decreases. Accordingly, the element, even it has a smaller element area, is not broken when it is subjected to a large current flowing due to the ESD surge. Thus, an economical protecting element is obtained even it has a smaller element area.

Furthermore, no thyristor element is required. In other words, the semiconductor device no longer encounters with a problem that the current continuously flows after the thyristor element latches in response to the surge voltage. In this respect, the semiconductor device of this invention can be applied to an output protecting circuit or a comparable circuit having lower circuit impedance.

The present invention provides a second semiconductor device interposed between an input/output terminal and a ground terminal of a semiconductor integrated circuit, and serving as a protecting element for protecting the semiconductor integrated circuit against electrostatic discharge. The second semiconductor device includes first and second NPN transistors and a PNP transistor. The first and second NPN transistors have emitters being commonly connected. The first NPN transistor has a collector and a base connected to the input/output terminal. The second NPN transistor has a collector and a base electrode connected to the ground terminal. The PNP transistor has a base commonly connected to the emitters of the first and second NPN transistors, an emitter connected to the input/output terminal, and a collector connected to the ground terminal.

This semiconductor device is used as a protecting element for protecting a semiconductor integrated circuit. The surge voltage can be suppressed. Temperature rise of the protecting element can be limited to a low level.

The present invention provides a third semiconductor device interposed between an input/output terminal and a ground terminal of a semiconductor integrated circuit, and serving as a protecting element for protecting the semiconductor integrated circuit against electrostatic discharge. The third semiconductor device includes an NPN transistor, a PNP transistor and a diode. An emitter of the NPN transistor, a base of the PNP transistor, and a cathode of the diode are commonly connected. An anode of the diode and an emitter of the PNP transistor are connected to the input/output terminal. A collector and a base of the NPN transistor are connected to the ground terminal, and a collector of the PNP transistor is connected to the ground terminal.

Hole injection easily occurs via a diode at a connecting portion between the emitter of the NPN transistor and the base of the PNP transistor. Due to the thyristor action, temperature rise can be further suppressed to a lower level.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Embodiment

<A-1. Arrangement of Device>

The arrangement of a protecting element 100, serving as a semiconductor device in accordance with a first embodiment of the present invention, will be explained with reference to FIGS. 1 and 2.

Figure 1:
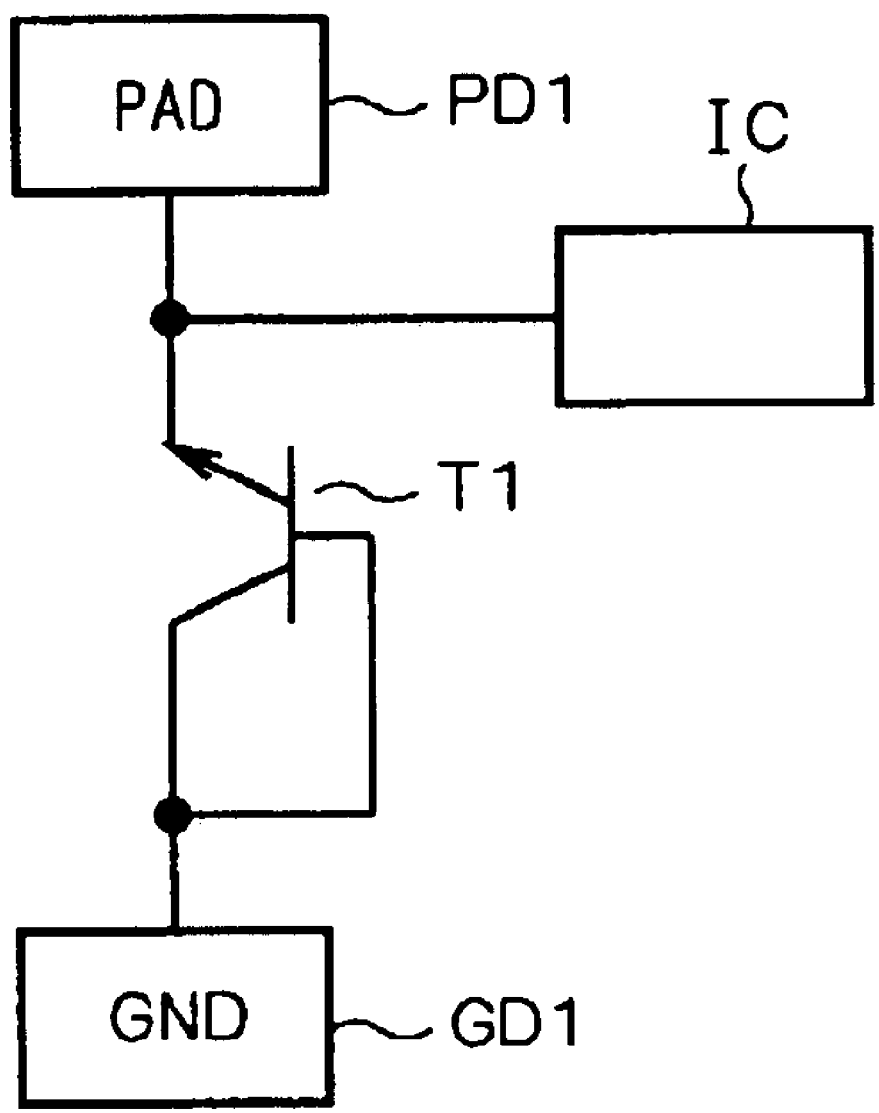
FIG. 1 is a circuit diagram showing the arrangement of a protecting element in accordance with a first embodiment of the present invention.

As shown in FIG. 1, the protecting element 100 includes an NPN transistor T1 having an emitter connected to an input/output terminal PD1 and a collector and a base connected to a ground terminal GD1. The input/output terminal PD1 has the possibility of receiving a surge voltage. The input/output terminal PD1, which may be referred to as a pad, is connected to a semiconductor integrated circuit IC to be protected against the surge voltage. The arrangement of the semiconductor integrated circuit IC is not limited to a specific one and therefore will not be explained.

Next, the arrangement of the protecting element 100 will be explained with reference to a cross-sectional view of FIG. 2.

Figure 2:
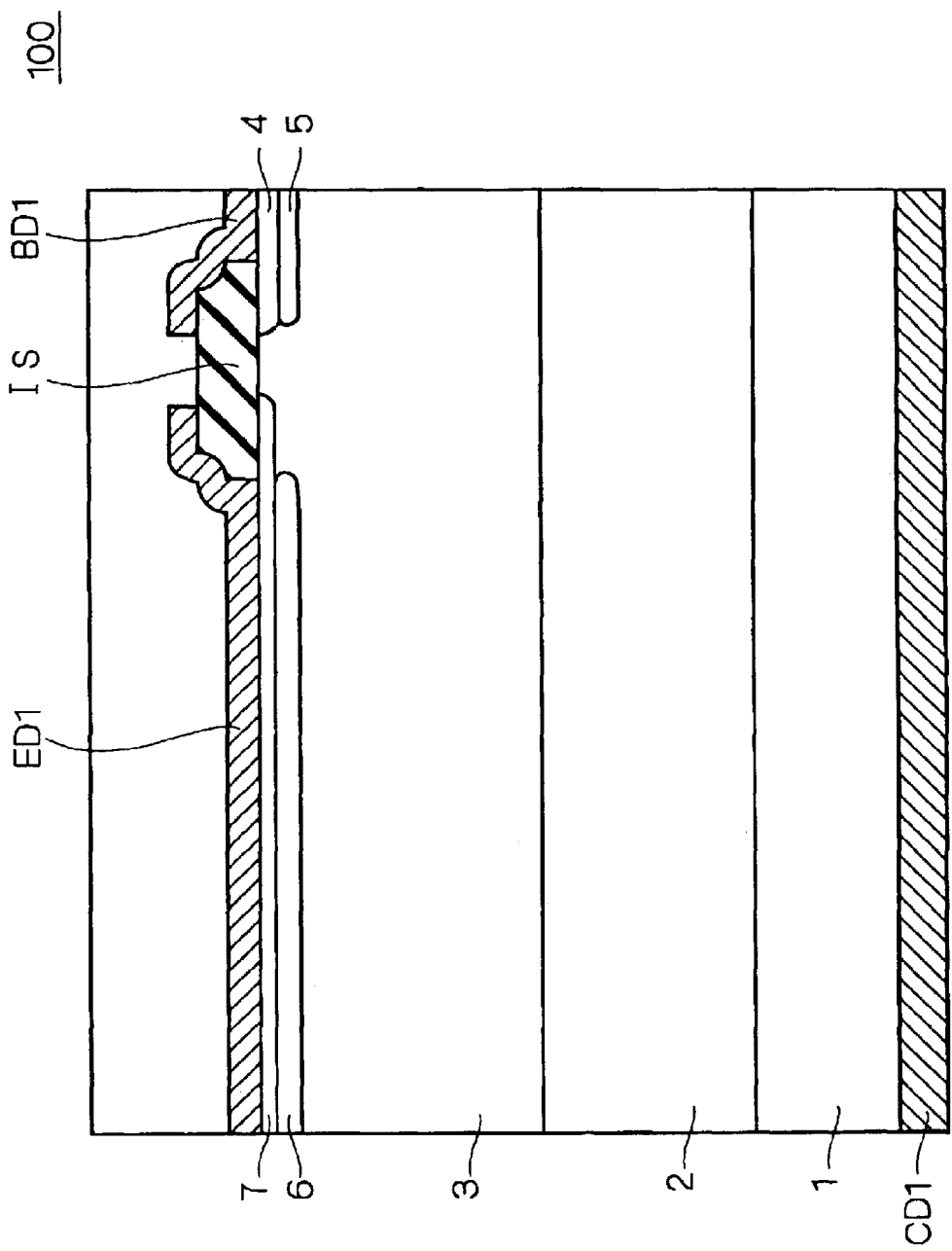
FIG. 2 is a cross-sectional diagram showing the arrangement of the protecting element in accordance with the first embodiment of the present invention.

As shown in FIG. 2, the protecting element 100 includes a collector electrode CD1 connected to the ground terminal GD1 shown in FIG. 1 and an N-type collector region 1 provided on the collector electrode CD1. The N-type collector region 1 contains N-type impurities at a relatively higher concentration ($5\times10^{18}/cm^3$ to $5\times10^{19}/cm^3$). A low-concentration N-type collector region 2, disposed on the N-type collector region 1, contains N-type impurities at a relatively lower concentration ($5\times10^{14}/cm^3$ to $1\times10^{16}/cm^3$). A P-type base region 3, disposed on the low-concentration N-type collector region 2, contains P-type impurities at a concentration of $1\times10^{15}/cm^3$ to $1\times10^{17}/cm^3$. The N-type collector region 1, the low-concentration N-type collector region 2, and the P-type base region 3 cooperatively constitute a semiconductor substrate and, therefore, may be collectively referred to as a semiconductor substrate.

A base contact region 4 and an N-type emitter region 7 are selectively provided in a surface of the P-type base region 3. The base contact region 4 contains P-type impurities at a relatively higher concentration ($5\times10^{19}/cm^3$ to $1\times10^{21}/cm^3$). The N-type emitter region 7 contains N-type impurities at a relatively higher concentration ($5\times10^{19}/cm^3$ to $1\times10^{21}/cm^3$).

Furthermore, a P-type impurity region 6 (i.e., first P-type impurity region) and a P-type impurity region 5 (i.e., second P-type impurity region) are also provided in the surface of the P-type base region 3. The P-type impurity region 6, brought into contact with the N-type emitter region 7, develops into a deeper position compared with the N-type emitter region 7 and contains P-type impurities at a relatively higher concentration ($3\times10^{16}/cm^3$ to $3\times10^{17}cm^3$). The P-type impurity region 5, brought into contact with the base contact region 4, develops into a deeper position compared with the base contact region 4 and contains P-type impurities at a relatively higher concentration ($3\times10^{16}/cm^3$ to $3\times10^{17}/cm^3$).

The base contact region 4 and the N-type emitter region 7 are spaced from each other. An insulating film IS is selectively disposed so that it straddles between end surfaces of the base contact region 4 and the N-type emitter region 7 which are exposed at the same level with a main surface of the P-type base region 3.

A base electrode BD1 is disposed on the surface of the base contact region 4 which is exposed at the same level with the main surface of the P-type base region 3. An emitter electrode ED1 is disposed on the surface of the N-type emitter 7 which is exposed at the same level with the main surface of the P-type base region 3. The base electrode BD1 is connected to the ground electrode GD1 shown in FIG. 1. The emitter electrode ED1 is connected to the input/output terminal of PD1.

The base electrode BD1 and the emitter electrode ED1 are electrically insulated from each other by the insulating film IS.

As explained above, the N-type collector region 1, the P-type base region 3 and the N-type emitter region 7 constitute the NPN transistor T1. The main current of the NPN transistor T1 flows in the direction normal to the main surface of the substrate. In this respect, this transistor can be regarded as a vertical NPN transistor.

According to the above-described protecting element 100, the collector electrode CD1 is formed on a different main surface which is opposed to the main surface on which the base electrode BD1 and the emitter electrode ED1 are formed. However, the collector electrode CD1 is often formed on the same main surface together with the base electrode BD1 and the emitter electrode ED1, with the N-type collector region 1 being electrically connected to the collector electrode CD1.

<A-2. Operation of Device>

Hereinafter, the operation of the protecting element 100 will be explained with reference to FIGS. 1 and 2 and also based on FIGS. 3 to 8.

Figure 3:
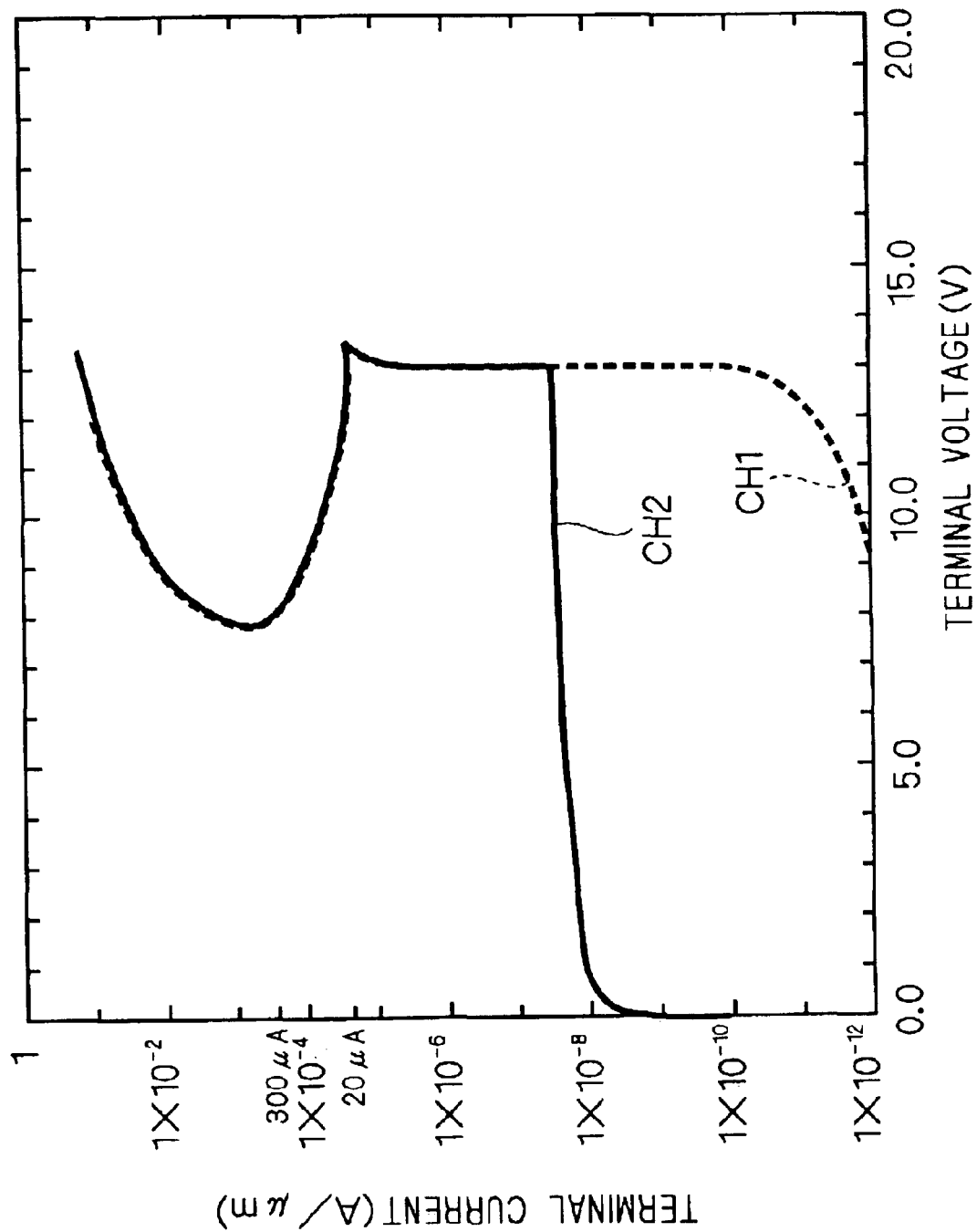
FIG. 3 is a graph explaining the operating characteristics of the protecting element in accordance with the first embodiment of the present invention.

FIG. 3 shows device simulation result of the current-voltage characteristics obtained when a positive bias is applied to the input/output terminal PD1 (shown in FIG. 1) relative to the ground terminal GD1 (shown in FIG. 1) of the protecting element 100.

In FIG. 3, an abscissa represents a terminal voltage (V) applied to the input/output terminal PD1 and an ordinate represents a terminal current (A/$\mu$m) flowing across the input/output terminal PD1. The numerical values on the ordinate are shown according to the logarithmic expression.

In FIG. 3, the characteristic curve CH1 indicated by a dotted line shows general stationary solution of the breakdown characteristics according to the device simulation. The characteristic curve CH2 indicated by a solid line shows transient solution obtained by continuously increasing the current at a constant time rate (in this case, 10 mA/$\mu$m per second).

The stationary solution of breakdown characteristics according to the device simulation may not converge in the process of increasing the current. It is therefore recommendable to rely on the transient solution in the event that the performance to be evaluated is in the high current region like the above case.

However, as shown in FIG. 3, an applied voltage is less than the breakdown voltage (in this case, 13V), a leakage current due to the transient solution becomes excessively large. This is derived from the displacement current flowing across the reverse biased P-N junction, and is different from a direct-current type leakage current.

As shown in FIG. 3, when the terminal current is equivalent to or less than 10 $\mu$A/$\mu$m, the breakdown occurs at the terminal voltage of approximately 13V. After the terminal current exceeds approximately 20 $\mu$A/$\mu$m, the terminal voltage turns into a decreasing phase and reaches the minimum value (approximately 8V) at the terminal current of approximately 300 $\mu$A/$\mu$m. After the terminal current exceeds this level, the terminal voltage increases monotonously. The following is the reason why such characteristics are obtained.

Namely, when the terminal current is in the low current region equivalent to or lower than 10 $\mu$A/$\mu$m, the breakdown occurs at the emitter-base junction. The current flows mostly from the emitter to the base. Meanwhile, the potential in the P-type base region 3 increases with increasing terminal current. After the terminal current exceeds 10 $\mu$A/$\mu$m, the base-collector junction goes into the forward bias condition.

In this condition, the NPN transistor T1 starts reverse operation and acts as a reversed NPN transistor. The reversed NPN transistor is generally referred to as having opposite connecting relationship between the emitter and the collector when compared with the NPN transistor. In the device simulation, it is evaluated as reverse characteristics.

The reversed NPN transistor maintains the withstand voltage by sustain action. The sustain action is the phenomenon that impact ionization at the base-collector junction produces minority carries and the current of minority carries flows into the base as an effective base current exceeding the base current supplied from the outside. As a result, the sustain action produces a large collector current.

When the base-collector junction is brought into the forward bias, conductivity modulation will appear in the N-type collector region 2 having a lower purity concentration. The resistance component decreases. Hence, the terminal voltage turns into a decreasing phase when the terminal current is in the region from 20 $\mu$A/$\mu$m to 300 $\mu$A/$\mu$m.

Then, it is believed that, after the terminal current exceeds 300 $\mu$A/$\mu$m, the current flowing across the P-type base region 3 causes voltage drop and accordingly the differential resistance turns to a positive value and the terminal voltage turns into an increasing phase.

Figure 4:
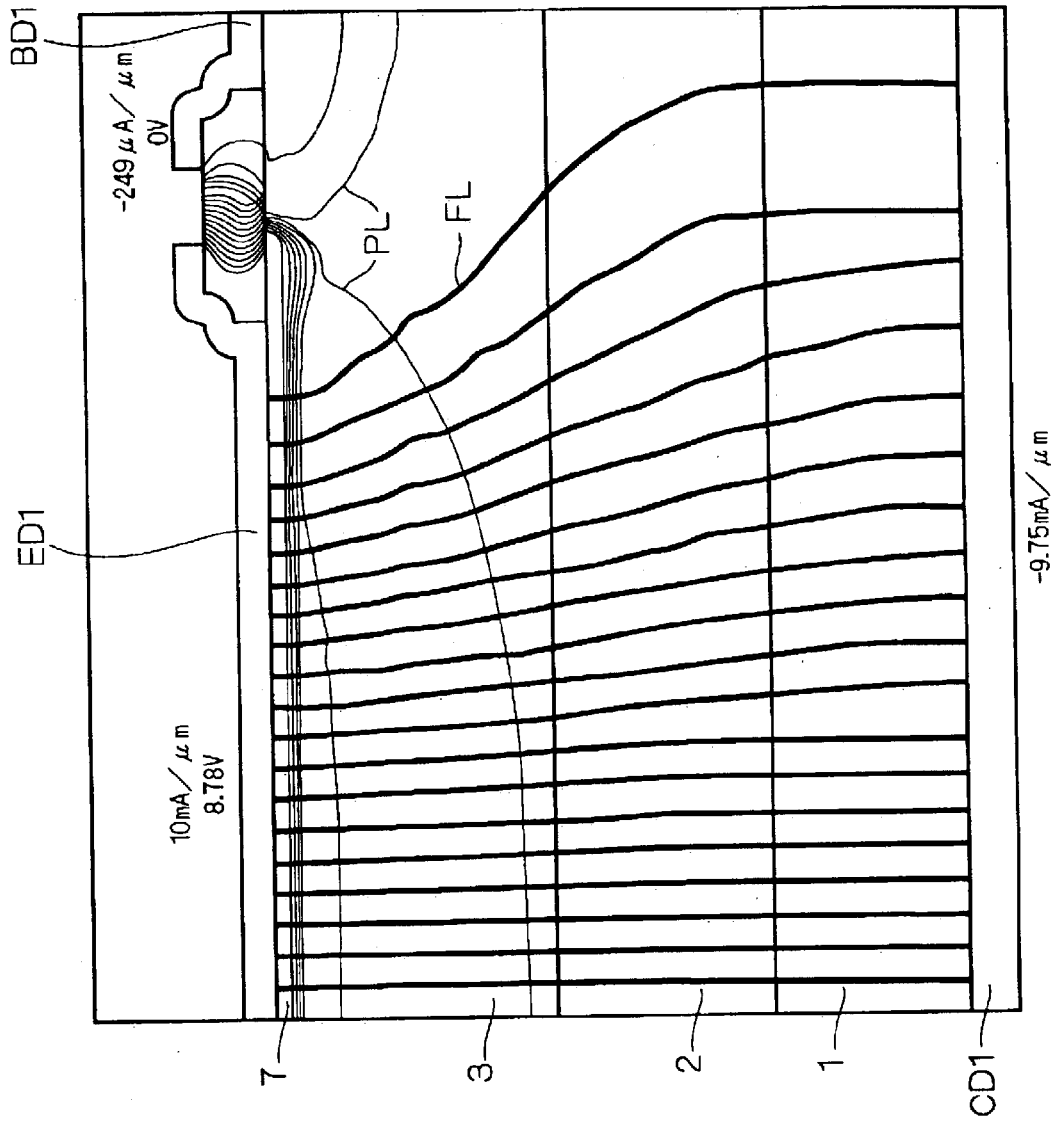
FIG. 4 is a diagram showing the simulation result with respect to current and potential distribution of the protecting element in accordance with the first embodiment of the present invention.

The above-described large current behavior is proved by FIG. 4 which shows the simulation result of current and potential distribution under a condition that the current of 10 mA/$\mu$m flows across the protecting element 100.

More specifically, FIG. 4 is a diagram showing current lines FL and equipotential lines PL representing the current and potential distribution in the protecting element 100. The equipotential lines PL are shown in such a manner that the electric potential increases with decreasing distance to the emitter electrode ED1. Regarding the conditions of this simulation, the voltage of 8.78V was applied to the emitter electrode ED1 to supply the current of 10 mA/$\mu$m.

The simulation reveals that up to 97.5% of the current flowing across the emitter electrode ED1 flows into the collector electrode CD1 and accordingly the base electrode BD1 is very small.

Furthermore, in the inside of the P-type base region 3, the gap between the equipotential lines PL becomes wide with decreasing distance to the left edge of the drawing. From this, it is known that the voltage drop occurs when the current flows.

Furthermore, the current flow in the layer just beneath the emitter electrode ED1 has extremely uniform distribution and accordingly eliminates the concentration of currents. This is realized by the arrangement that P-type impurity region 6 having a higher concentration is positioned under the N-type emitter region 7 having relatively higher concentration. With this arrangement, the breakdown voltage of the emitter-base junction is set to be slightly lower than that of the emitter and its vicinity.

Figure 5:
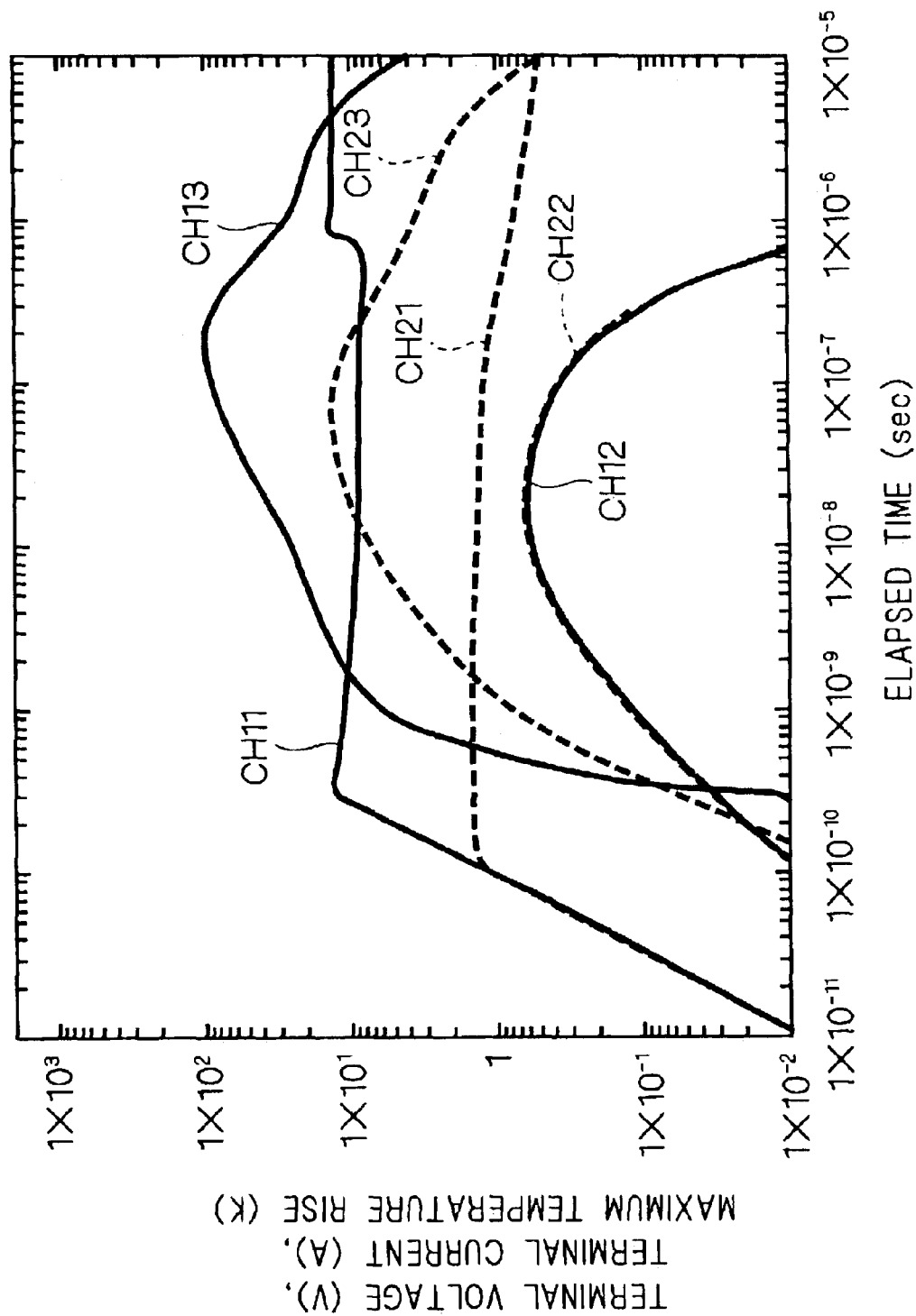
FIG. 5 is a graph explaining the operating characteristics of the protecting element in accordance with the first embodiment of the present invention.

Next, FIG. 5 shows device simulation result representing the response characteristics of the protecting element 100 in the case that an electrostatic discharge surge of 1 kV based on the human body model (HBM) is applied to the protecting element 100. The protecting element 100 is regarded as having a width of 100 μm in the depth direction. To obtain this value, it is assumed that ESD causes a pulse current of approximately 1A and an element area required for safely supplying this current is obtained, and then the obtained area is divided by the element width.

In FIG. 5, the abscissa represents an elapsed time (sec) and the ordinate represents each of the terminal voltage (V), the terminal current (A) and a maximum temperature rise (K). The numerical values on the abscissa and the ordinate are shown according to the logarithmic expression.

In FIG. 5, the solid lines show various response characteristics of the protecting element 100 in the case that a positive bias is given to the input/output terminal PD1 with respect to the ground terminal GD1, i.e., when a positive surge voltage is applied to the protecting element 100. On the other hand, the dotted lines show various response characteristics of the protecting element 100 in the case that a negative bias is given to the input/output terminal PD1 with respect to the ground terminal GD1, i.e., when a negative surge voltage is applied to the protecting element 100. CH11, CH12 and CH13 respectively represent the characteristic curves of the terminal voltage, the terminal current and the maximum temperature rise under the condition that the positive surge voltage is applied to the protecting element 100 CH21, CH22 and CH23 respectively represent the characteristic curves of the terminal voltage, the terminal current and the maximum temperature rise under the condition that the negative surge voltage is applied to the protecting element 100. The characteristic curves CH12 and CH22 are identical with each other and accordingly overlap completely in the drawing.

As shown in FIG. 5, when the positive surge voltage is applied to the protecting element 100, the terminal voltage increases and reaches to approximately 14V (refer to CH11) at the elapsed time of approximately 300 psec after the surge application. Then, the terminal voltage gradually decreases and becomes approximately 9V at the elapsed time of 20 nsec while the terminal current reaches the peak (refer to CH12). Then, the terminal current decreases down to the level of several mA (=several tens μA/μm) while the terminal voltage restores to 13V.

Furthermore, the maximum temperature rise becomes approximately 90K at the elapsed time of approximately 200 nsec which is fairly late compared with the peak of the terminal current. However, for the element, this value is within the safe zone.

Figure 6:
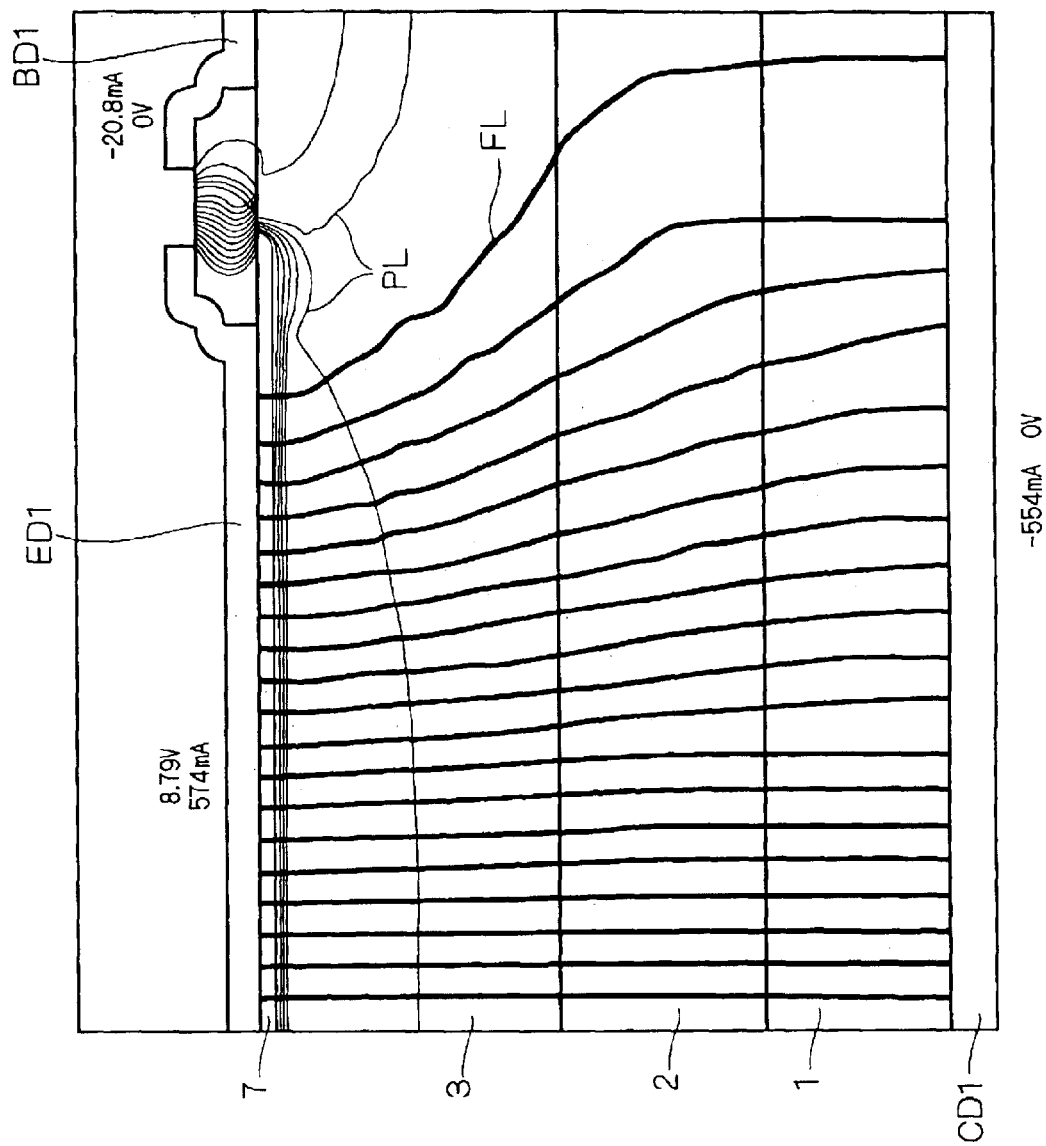
FIG. 6 is a diagram showing the simulation result with respect to current and potential distribution of the protecting element in accordance with the first embodiment of the present invention.

FIG. 6 shows the current and potential distribution in the protecting element 100 at the elapsed time of 30 nsec after the positive surge voltage is applied. In FIG. 6, equipotential lines PL are shown in such a manner that the electric potential increases with decreasing distance to the emitter electrode ED1. At this moment, the voltage of 8.79V is applied to the emitter electrode ED1 and the current of 574 mA flows.

Like the current and voltage simulation result under the large current stationary condition shown in FIG. 4, the illustration of FIG. 6 reveals that most of the current flows from the emitter to the collector and the current flowing into the base is very few.

Now returning to the explanation of FIG. 5, when a negative surge voltage is applied to the protecting element 100, the terminal voltage is clamped to approximately 1.5 V (refer to CH21). The maximum temperature rise is a lower value of approximately 14K (refer to CH23). This is believed that the base-emitter junction is brought into a forward bias when the negative surge voltage is applied and the element operates as an ordinary NPN transistor having the collector and the base being short circuited.

Figure 7:
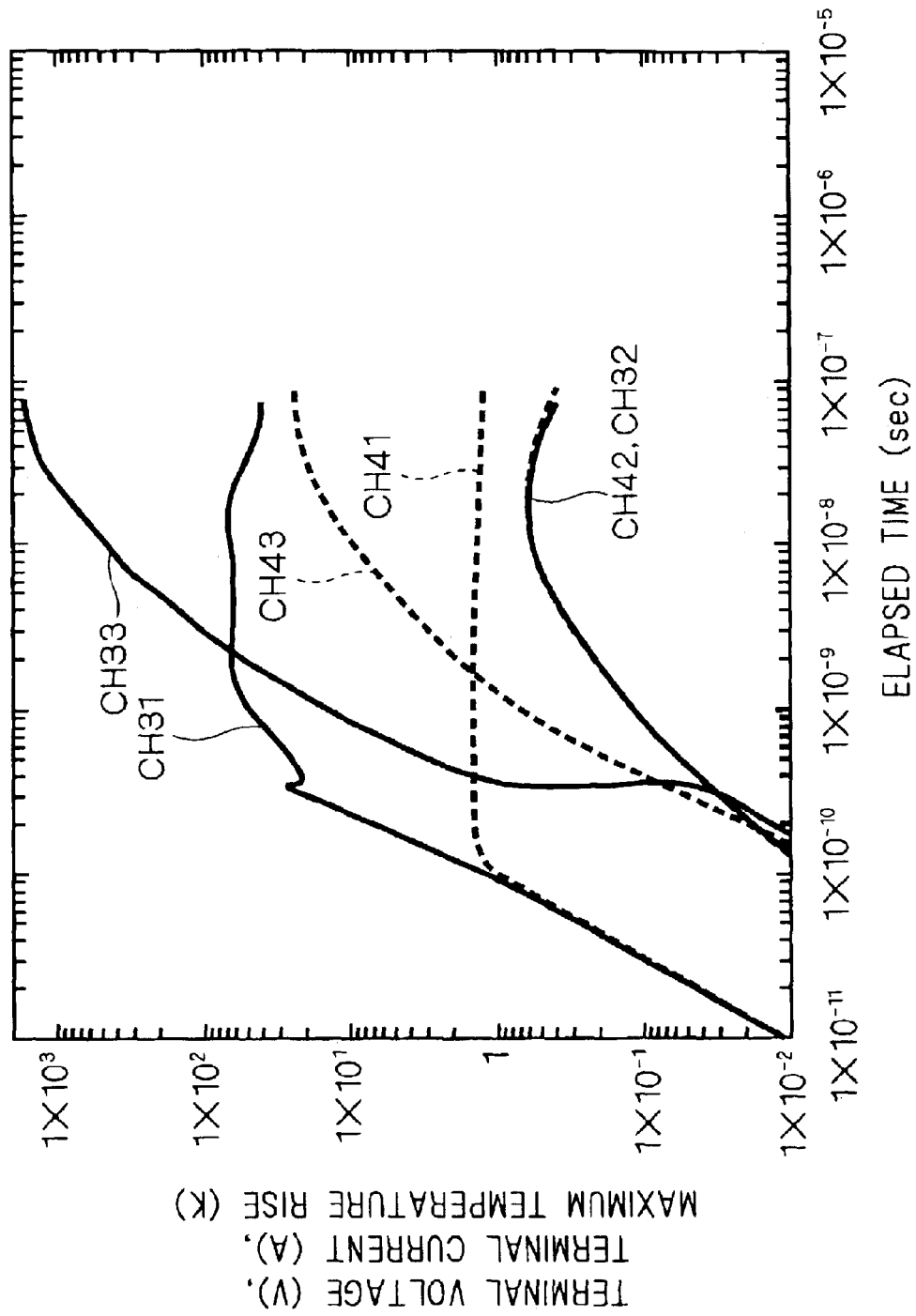
FIG. 7 is a graph explaining the operating characteristics of the protecting element in accordance with the first embodiment of the present invention.

FIG. 7 shows device simulation result representing the response characteristics of the protecting element 100 in the case that ESD surge is applied to the protecting element 100 under the condition that the collector electrode CD1 is not connected to the ground terminal GD1. The protecting element 100 is regarded as having a width of 100 μm in the depth direction. In FIG. 7, the abscissa represents the elapsed time (see) and the ordinate represents each of the terminal voltage (V), the terminal current (A) and the maximum temperature rise (K). The numerical values on the abscissa and the ordinate are shown according to the logarithmic expression.

In FIG. 7, the solid lines show various response characteristics of the protecting element 100 in the case that a positive bias is given to the input/output terminal PD1 with respect to the ground terminal GD1, i.e., when a positive surge voltage is applied to the protecting element 100. On the other hand, the dotted lines show various response characteristics of the protecting element 100 in the case that a negative bias is given to the input/output terminal PD1 with respect to the ground terminal GD1, i.e., when a negative surge voltage is applied to the protecting element 100. CH31, CH32 and CH33 respectively represent the characteristic curves of the terminal voltage, the terminal current and the maximum temperature rise under the condition that the positive surge voltage is applied to the protecting element 100. CH41, CH42 and CH43 respectively represent the characteristic curves of the terminal voltage, the terminal current and the maximum temperature rise under the condition that the negative surge voltage is applied to the protecting element 100. The characteristic curves CH32 and CH42 are identical with each other and accordingly overlap completely in the drawing.

As shown in FIG. 7, when the positive surge voltage is applied to the protecting element 100, the terminal voltage increases and reaches to approximately 70V at maximum and the maximum temperature rise is approximately 2,000K. This means that the protecting element 100 cannot operate in the ordinary manner. The protecting element 100 may break due to heat.

Figure 8:
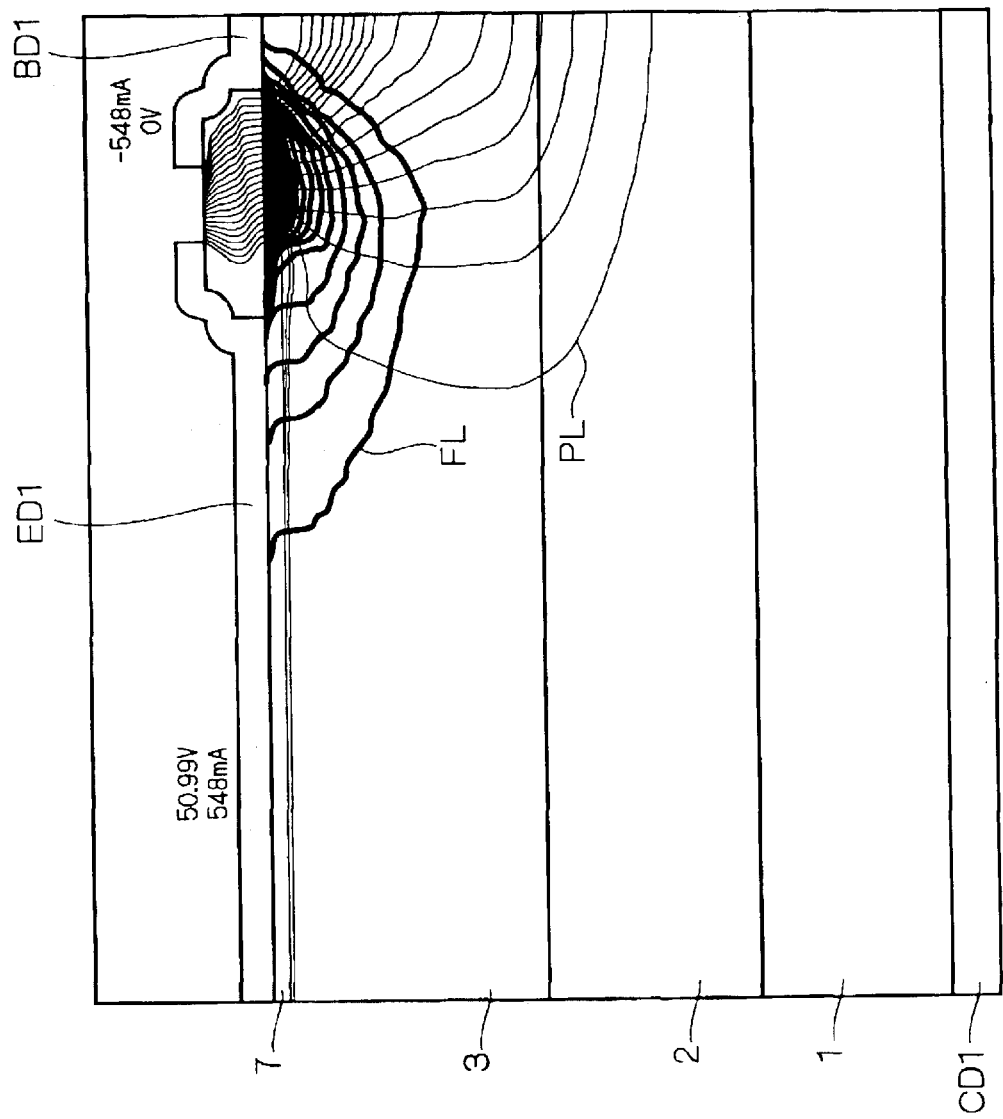
FIG. 8 is a diagram showing the simulation result with respect to current and potential distribution of the protecting element in accordance with the first embodiment of the present invention.

FIG. 8 shows the current and potential distribution in the protecting element 100 at the elapsed time of 30 nsec in this simulation. In FIG. 6, equipotential lines PL are shown in such a manner that the electric potential increases with decreasing distance to the emitter electrode ED1. At this moment, the voltage of 50.99V is applied to the emitter electrode ED1 and the current of 548 mA flows.

As understood from FIG. 8, all of the current flows from the emitter electrode ED1 to the base electrode BD1 via a very narrow region in the vicinity of the P-type base region 3. The current density is extremely high. This is the reason why the voltage drop and the temperature rise are large.

<A-3. Effect>

As explained above, the vertical NPN transistor T1 has the collector and the base being commonly connected to the ground potential, and using the vertical NPN transistor T1 as the protecting element 100 makes it possible to suppress the surge voltage and also suppress the temperature rise of the protecting element 100.

Furthermore, as explained with reference to FIG. 3, the base-collector junction turns into the forward bias when the terminal current exceeds approximately 20 μm. The conductivity modulation will appear in the N-type collector region 2 having a lower purity concentration. The resistance component decreases. Accordingly, the element, even it has a smaller element area, is not broken when it is subjected to a large current flowing due to the ESD surge. Thus, an economical protecting element is obtained even it has a smaller element area.

Furthermore, no thyristor element is required. In other words, the protecting element no longer encounters with the problem that the current continuously flows after the thyristor element latches in response to the surge voltage. In this respect, the protecting element can be applied to an output protecting circuit or a comparable circuit having lower circuit impedance.

Furthermore, as explained with reference to FIG. 5, the terminal voltage becomes approximately 8V when the surge voltage is applied. This means that the element withstand voltage decreases down to approximately 8V when the surge voltage is applied. In other words, the element withstand voltage does not decrease beyond the level of approximately 8V. Hence, if there is any other path capable of inputting the voltage to the input/output terminal PD1 other than the path for inputting the surge, a voltage may enter steadily from an external power source. In such a case, if this voltage is lower than 8V, there is no possibility that, after the surge current has completely flowed, any current flows from the above-described external power source into the ground side via the protecting element 100.

Accordingly, the protecting element 100 can be effectively used for protecting a CMOS output circuit having an operating voltage of, for example, 5V against the surge.

In the above-described explanation, the minimum element withstand voltage is approximately 8V when the surge voltage is applied. This value represents a withstand voltage under the condition that the NPN transistor T1 acts as a reversed NPN transistor to hold the withstand voltage.

<B. Second Embodiment>
<B-1. Arrangement of Device>

The arrangement of a protecting element 200, serving as a semiconductor device in accordance with a second embodiment of the present invention, will be explained with reference to FIGS. 9 and 10.

Figure 9:
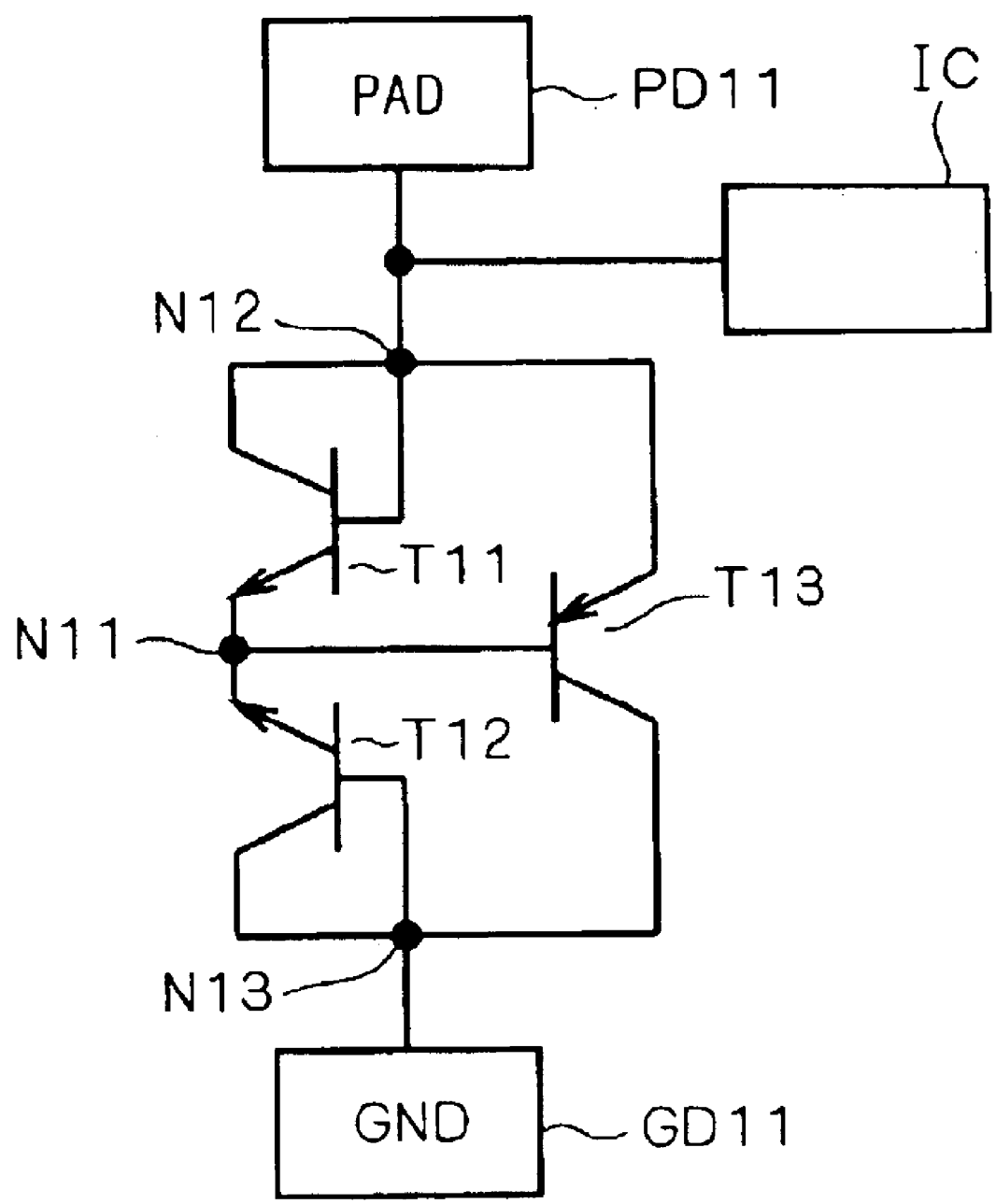
FIG. 9 is a circuit diagram showing the arrangement of a protecting element in accordance with a second embodiment of the present invention.

As shown in FIG. 9, the protecting element 200 includes NPN transistors T11 and T12 and a PNP transistor T13.

The NPN transistors T11 and T12 have emitters commonly connected at a node N11 so as to form a reversed serial connection. The NPN transistor T11 has a collector and a base commonly connected at a node N12. The NPN transistor T12 has a collector and a base commonly connected at a node N13. An input/output terminal PD11 is connected to the node N12. An emitter of the PNP transistor T13 is also connected to the node N12. A ground terminal GD11 is connected to the node N13. A collector of the PNP transistor T13 is also connected to the node N13.

Then, the PNP transistor T13 has a base connected to the node N11.

The input/output terminal PD11 is connected to a semiconductor integrated circuit IC to be protected against the surge voltage. The arrangement of the semiconductor integrated circuit IC is not limited to a specific one and therefore will not be explained.

Next, the arrangement of the protecting element 200 will be explained with reference to a cross-sectional view of FIG. 10.

Figure 10:
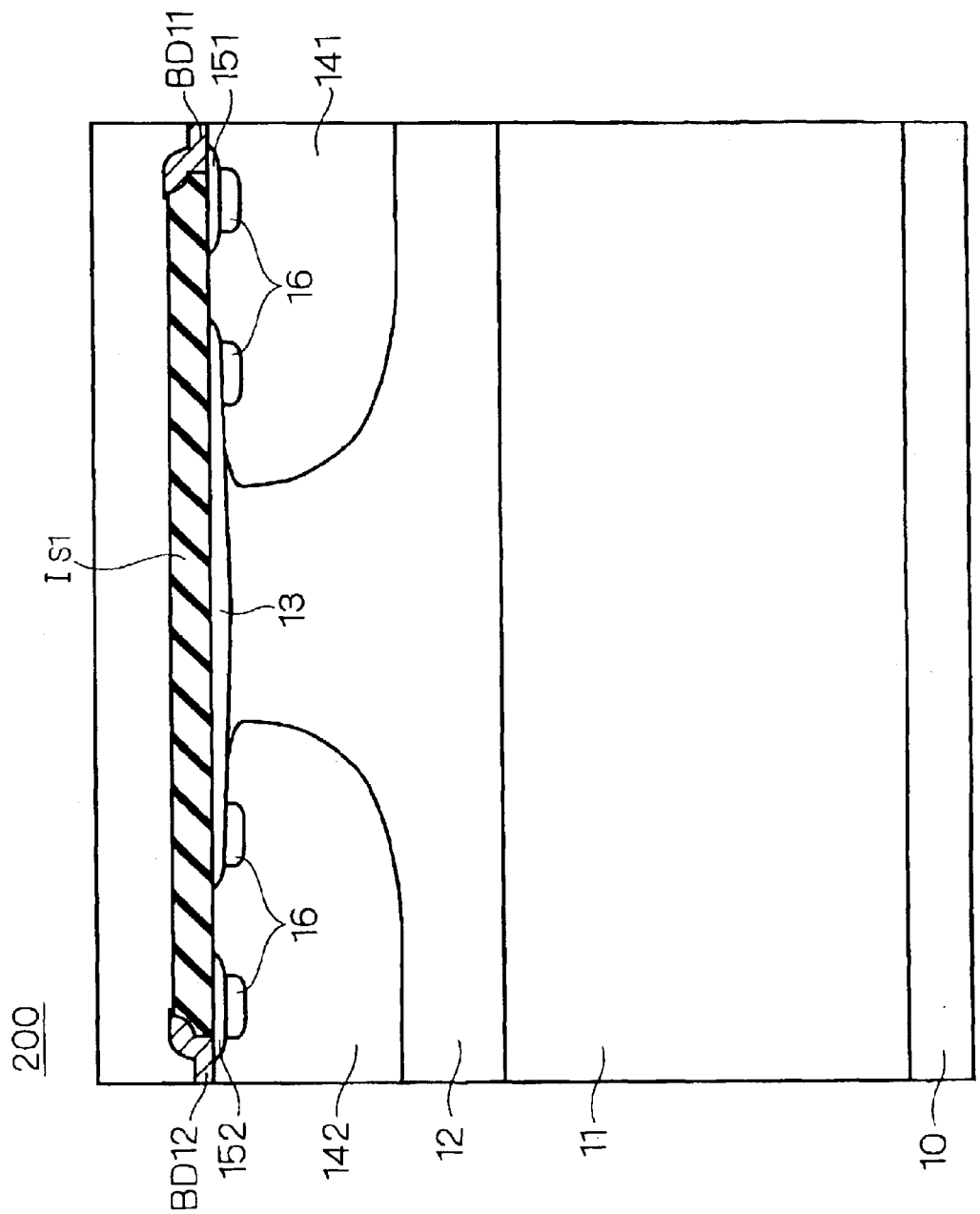
FIG. 10 is a cross-sectional diagram showing the arrangement of the protecting element in accordance with the second embodiment of the present invention.

As shown in FIG. 10, the protecting element 200 includes a P-type semiconductor substrate 10 and a high-concentration N-type impurity region 11 provided on the P-type semiconductor substrate 10. The high-concentration N-type impurity region 11 contains N-type impurities at a relatively higher concentration ($5 \times 10^{18}/cm^3$ to $5 \times 10^{19}/cm^3$). A low-concentration N-type impurity region 12, disposed on the high-concentration N-type impurity region 11, contains N-type impurities at a relatively lower concentration ($\times 10^{14}/cm^3$ to $1 \times 10^{16}/cm^3$). The P-type semiconductor substrate 10, the high-concentration N-type impurity region 11, and the low-concentration N-type impurity region 12 cooperatively constitute a semiconductor substrate and, therefore, may be collectively referred to as a semiconductor substrate.

An N-type emitter region 13, containing N-type impurities at a relatively higher concentration ($5 \times 10^{19}/cm^3$ to $1 \times 10^{21} cm^3$), is selectively provided in a surface of the low-concentration N-type impurity region 12. The N-type emitter region 13 is sandwiched by a pair of P-type base regions 141 and 142 (i.e., first and second P-type base regions) which are selectively disposed at both peripheral edges of the N-type emitter region 13. Each of the P-type base regions 141 and 142 contains P-type impurities at a relatively higher concentration ($1 \times 10^{15}/cm^3$ to $1 \times 10^{17}/cm^3$). Each of the P-type base regions 141 and 142 is brought into contact with the bottom of the peripheral edge of N-type emitter region 13, so as to form a P-N junction between them.

Furthermore, N-type collector regions 151 and 152 (i.e., first and second N-type collector regions), containing N-type impurities at a relatively higher concentration ($5 \times 10^{19}/cm^3$ to $1 \times 10^{21}/cm^3$), are selectively provided in the surface of the P-type base regions 141 and 142, respectively. The N-type collector regions 151 and 152 are spaced from the N-type emitter region 13.

Furthermore, P-type impurity regions 16, containing P-type impurities at a relatively higher concentration ($3 \times 10^{16}/cm^3$ to $3 \times 10^{17}/cm^3$), are selectively disposed in the surface of the P-type base regions 141 and 142 at the portions where the P-type base regions 141 and 142 are brought into contact with the N-type emitter region 13 so as to form the PN junctions and also in the surface of the P-type base regions 141 and 142 at the portions corresponding to the bottoms of the N-type collector regions 151 and 152.

Furthermore, a base-collector common electrode BD11 (i.e., first base-collector common electrode) is disposed so as to be brought into contact with a portion of the N-type collector region 151 which is exposed at the same level with the exposed surface of the P-type base region 141 and also brought into contact with a portion of the exposed surface of the P-type base region 141. Similarly, a base-collector common electrode BD12 (i.e., second base-collector common electrode) is disposed so as to be brought into contact with a portion of the N-type collector region 152 which is exposed at the same level with the exposed surface of the P-type base region 142 and also brought into contact with a portion of the exposed surface of the P-type base region 142. The N-type collector region 151 and the P-type base region 141 are commonly connected by the base-collector common electrode BD11. The N-type collector region 152 and the P-type base region 142 are commonly connected by the base-collector common electrode BD12.

In FIG. 10, the left-hand base-collector common electrode BD12 is connected to the ground terminal GD11 shown in FIG. 9. The right-hand base-collector common electrode BD11 is connected to the input/output terminal PD11 shown in FIG. 9.

Accordingly, the N-type collector region 152, the P-type base region 142, and the N-type emitter region 13 cooperatively constitute the NPN transistor T12. The N-type collector region 151, the P-type base region 141, and the N-type emitter region 13 cooperatively constitute the NPN transistor T11. The P-type base regions 141 and 142 and the N-type emitter region 13 cooperatively constitute the PNP transistor T13.

An insulating film IS1 covers all of the exposed surface of the N-type emitter region 13, and covers partly the exposed surfaces of the P-type base regions 141 and 142 interposed between the N-type emitter region 13 and the N-type collector regions 151 and 152, and also covers partly the exposed surfaces of the N-type collector regions 151 and 152. Two base-collector common electrodes BD11 and BD12 are electrically insulated from each other by the insulating film IS1.

The high-concentration N-type impurity region 11 can be held in a floating condition, or can be grounded.

In the case that the high-concentration N-type impurity region 11 is held in the floating condition, no wiring region (e.g., collector wall etc.) is necessary for electrically connecting the high-concentration N-type impurity region 11 to the wiring on the main surface. This is advantageous in that the area required for the protecting element is small.

Furthermore, even in the case that the high-concentration N-type impurity region 11 is grounded, expected effects can be obtained.

<B-2. Operation of Device>

Hereinafter, the operation of the protecting element 200 will be explained with reference to FIGS. 9 and 10 and also based on FIGS. 11 to 13.

Figure 11:
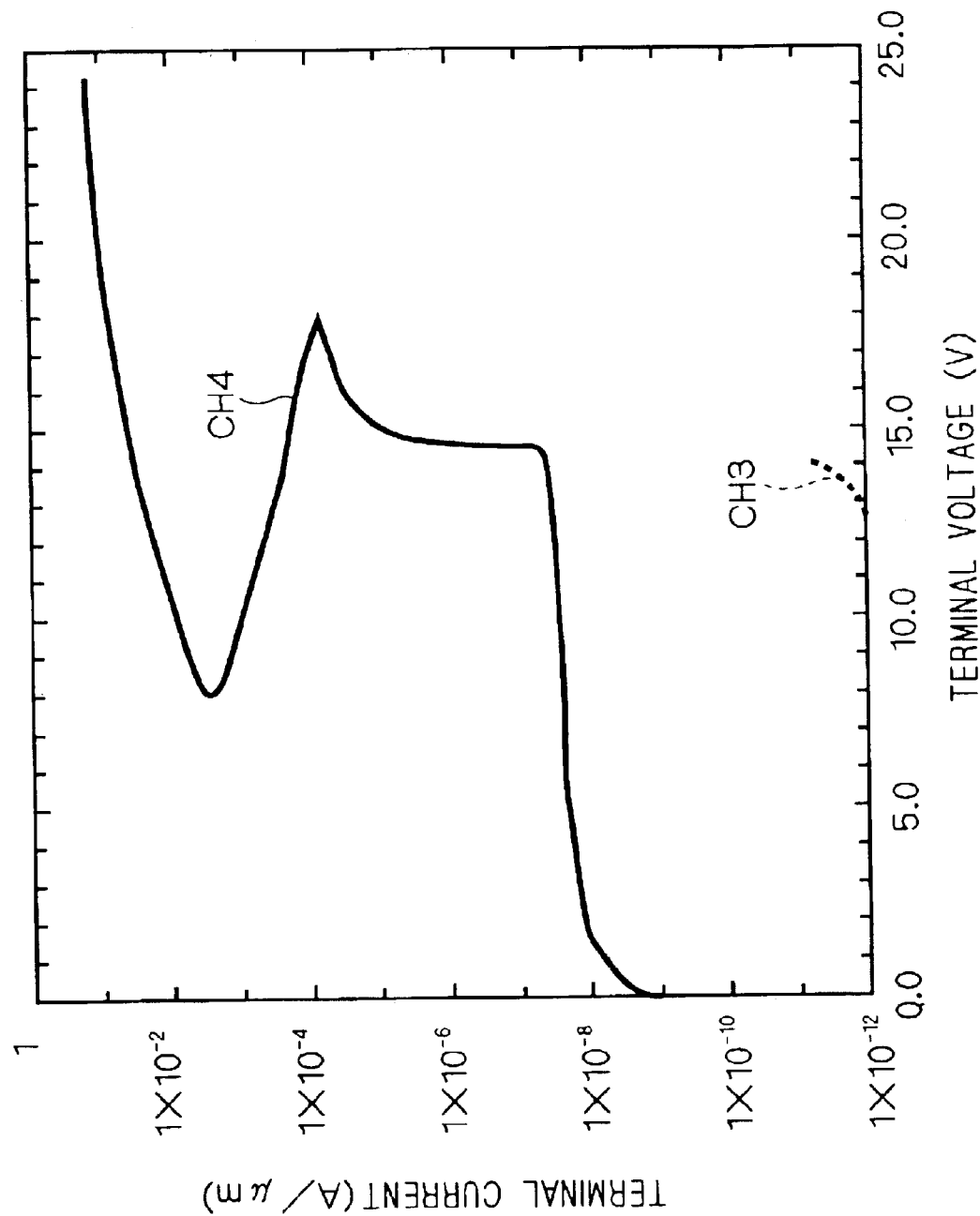
FIG. 11 is a graph explaining the operating characteristics of the protecting element in accordance with the second embodiment of the present invention.

FIG. 11 shows device simulation result of the current-voltage characteristics obtained when a positive bias is applied to the input/output terminal PD11 (shown in FIG. 9) relative to the ground terminal GD11 (shown in FIG. 9) of the protecting element 200.

In FIG. 11, an abscissa represents a terminal voltage (V) applied to the input/output terminal PD11 and an ordinate represents a terminal current (A/$\mu$m) flowing across the input/output terminal PD11. The numerical values on the ordinate are shown according to the logarithmic expression.

In FIG. 11, the characteristic curve CH3 indicated by a dotted line shows general stationary solution of the breakdown characteristics according to the device simulation. The characteristic curve CH4 indicated by a solid line shows transient solution obtained by continuously increasing the current at a constant time rate (in this case, 10 mA/$\mu$m per second).

In this simulation, according to the stationary solution, no convergence occurs in the stage that a small amount of current flows. On the other hand, according to the transient solution, calculation result can be obtained until the current increases up to a large current.

As understood from FIG. 11, the steep change of the current value is found when the applied voltage is less than the breakdown voltage (in this case, 14.5V). This is derived from the displacement current flowing across the reverse biased P-N junction.

As shown in FIG. 11, according to the transient solution, the breakdown occurs when the terminal current is in a low current region equivalent to or less than 100 nA/$\mu$m. After the terminal current exceeds 1 $\mu$A/$\mu$m, the terminal voltage starts increasing and reaches 18V at the terminal current of 80 $\mu$A/$\mu$m. After the terminal current exceeds this level, the terminal voltage decreases and reaches a local minimum point of 8V at the terminal current of approximately 3 mA/$\mu$m. After that, the terminal voltage increases monotonously.

According to the characteristic curve CH4, the minimum value of the terminal voltage is 8V and the terminal voltage once increases and then once decreases and finally increases. This tendency is similar to that of the characteristic curve CH2 shown in FIG. 3 which is according to the transient solution of the protecting element 100. However, the protecting element 200 has a larger maximum value of the terminal voltage.

Figure 12:
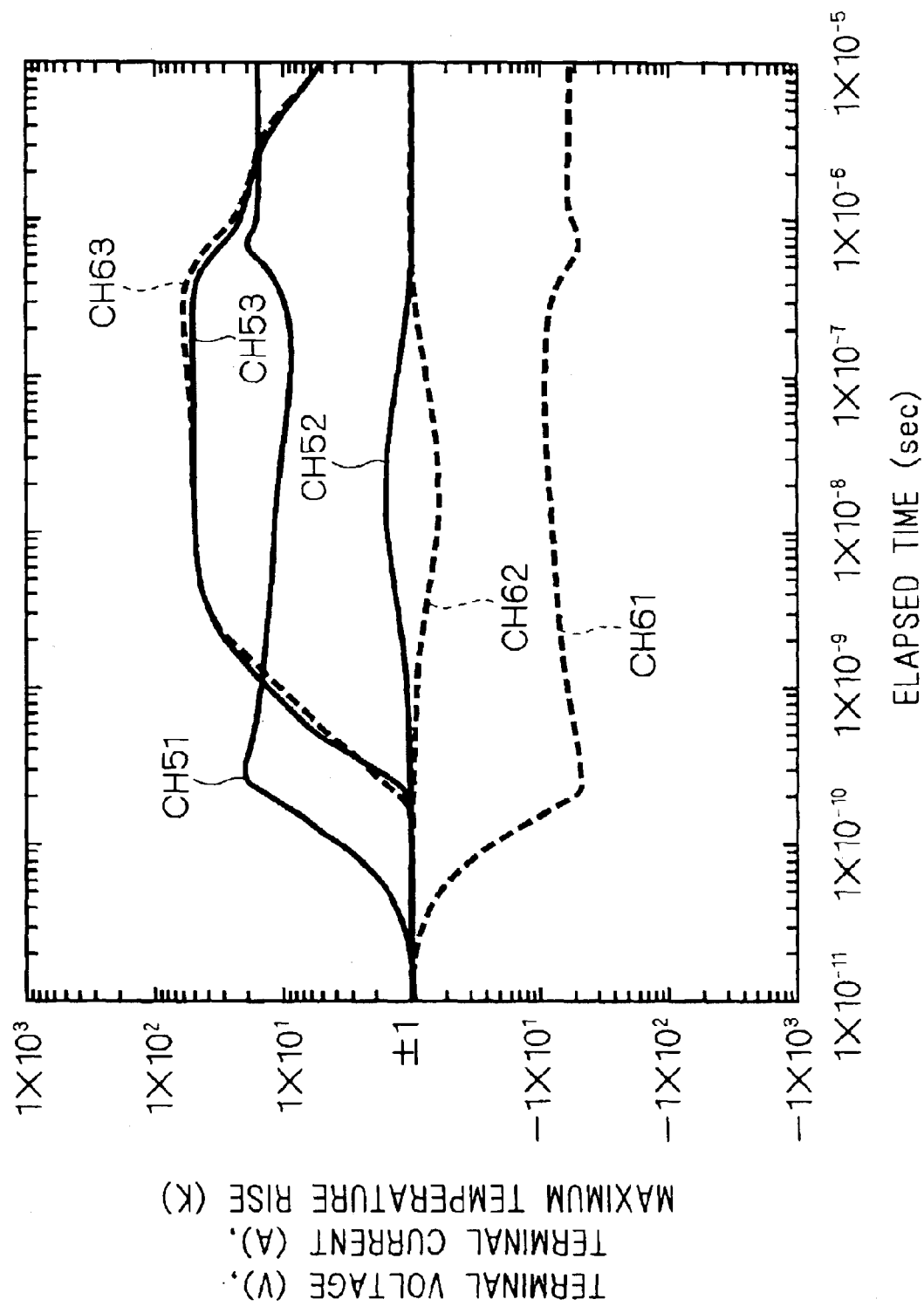
FIG. 12 is a graph explaining the operating characteristics of the protecting element in accordance with the second embodiment of the present invention.

Next, FIG. 12 shows device simulation result representing the response characteristics of the protecting element 200 in the case that an electrostatic discharge surge of 1 kV based on HBM is applied to the protecting element 200. The protecting element 200 is regarded as having a width of 100 $\mu$m in the depth direction.

In FIG. 12, the abscissa represents an elapsed time (sec) and the ordinate represents each of the terminal voltage (V), the terminal current (A) and the maximum temperature rise (K). The numerical values on the abscissa and the ordinate are shown according to the logarithmic expression. Regarding the terminal voltage (V), the terminal current (A) and the maximum temperature rise (K) on the ordinate, they have the center axis of +1V, ±1VA, and ±1K, respectively. The upper side of the center axis is positive values, while the lower side of the center axis is negative values.

In FIG. 12, the solid lines show various response characteristics of the protecting element 200 in the case that a positive bias is given to the input/output terminal PD11 with respect to the ground terminal GD11, i.e., when a positive surge voltage is applied to the protecting element 200. On the other hand, the dotted lines show various response characteristics of the protecting element 200 in the case that a negative bias is given to the input/output terminal PD11 with respect to the ground terminal GD11, i.e., when a negative surge voltage is applied to the protecting element 200. CH51, CH52 and CH53 respectively represent the characteristic curves of the terminal voltage, the terminal current and the maximum temperature rise under the condition that the positive surge voltage is applied to the protecting element 200. CH61, CH62 and CH63 respectively represent the characteristic curves of the terminal voltage, the terminal current and the maximum temperature rise under the condition that the negative surge voltage is applied to the protecting element 200.

As understood from FIG. 12, according to the protecting element 200, the characteristic curves of each of the terminal voltage and the terminal current are symmetric with respect to the center axis between the case that the positive surge voltage is applied and the case that the negative surge voltage is applied. The characteristics of the maximum temperature rise are not relevant to the polarity of the applied surge voltage.

The peak of the maximum temperature rise is approximately 50K which is lower when compared with the temperature characteristics of the protecting element 100 explained with reference to FIG. 5.

Furthermore, it is known that the terminal voltage increases instantaneously up to approximately 20V. However, a large thermal margin is assured.

Figure 13:
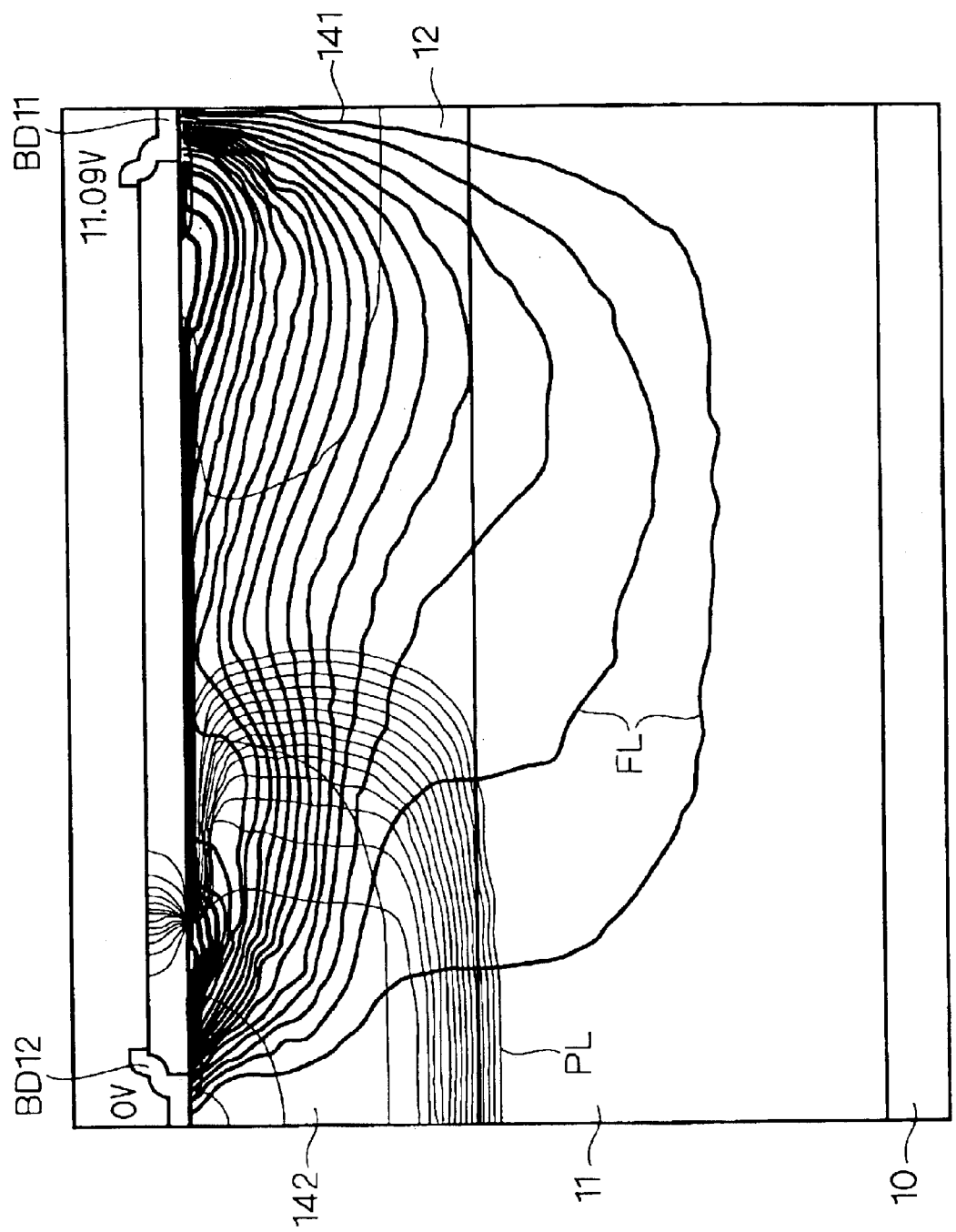
FIG. 13 is a diagram showing the simulation result with respect to current and potential distribution of the protecting element in accordance with the second embodiment of the present invention.

FIG. 13 shows the current and potential distribution in the protecting element 200 at the elapsed time of 10 nsec after the positive surge voltage is applied. In FIG. 13, equipotential lines PL are shown in such a manner that the electric potential increases with decreasing distance to the base-collector common electrode BD11. At this moment, the voltage of 11.09V is applied to the base-collector common electrode BD11.

As understood from FIG. 13, according to the protecting element 200, the main current flows in the direction substantially parallel to the main surface of the semiconductor substrate. Approximately 70% of the current flows separately in the relatively deep region of the low-concentration N-type impurity region 12 and the high-concentration N-type impurity region 11. Accordingly, it is believed that the current density in the vicinity of the P-N junction is reduced and the temperature rise is suppressed.

Furthermore, the P-type impurity regions 16 are provided in the surfaces of the P-type base regions 141 and 142 at the portions where the P-type base regions 141 and 142 and the N-type emitter region 13 are brought into contact with each other so as to form the P-N junction. This arrangement relieves the concentration of the current in this region.

<B-3. Effect>

As explained above, the NPN transistors T11 and T12 have the emitters being commonly connected to form the reversed serial connection. The PNP transistor T13 has the base connected to the common emitters of the NPN transistors T11 and T12. The main current flows in the direction substantially parallel to the main surface of the semiconductor substrate. Using the protecting element 200 having such an arrangement makes it possible to suppress the surge voltage. The temperature rise of the protecting element 200 can be further suppressed.

<B-4. Modified Embodiment 1>

According to the cross-sectional arrangement of the protecting element 200 shown in FIG. 10, the N-type collector regions 151 and 152 containing the N-type impurities at a relatively higher concentration are provided in the surface of the P-type base regions 141 and 142. It is however possible to omit the N-type collector region 151 connected to the base-collector common electrode BD11 of the pad side.

Figure 14:
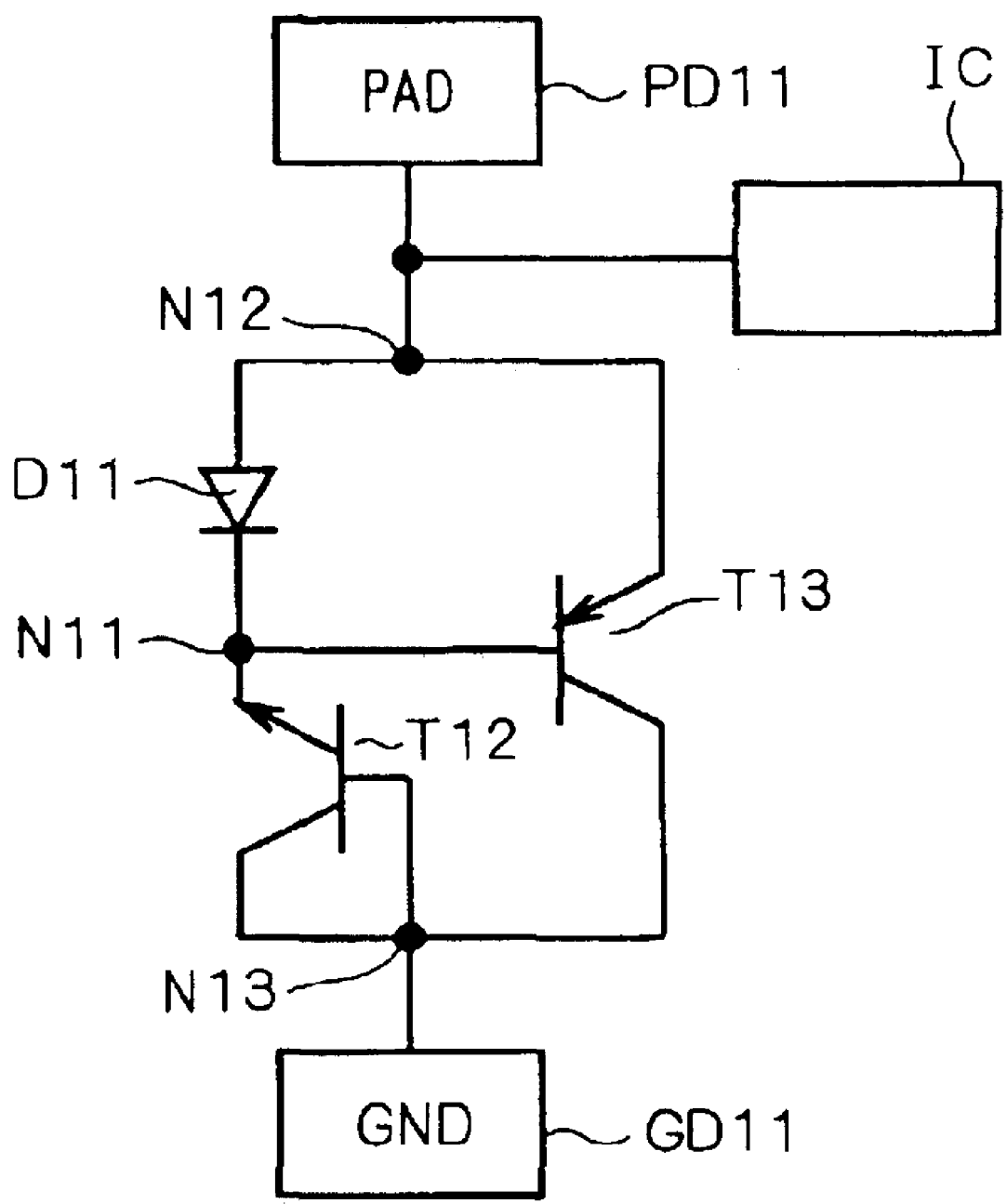
FIG. 14 is a circuit diagram showing a first modification of the protecting element in accordance with the second embodiment of the present invention.

FIG. 14 is a diagram showing the modified arrangement. As shown in FIG. 14, a protecting element 200A is different from the protecting element 200 shown in FIG. 9 in that the NPN transistor T11 is replaced by a diode D11. Accordingly, the base-collector common electrode BD11 shown in FIG. 10 should be renamed as an anode-emitter common electrode BD11. Furthermore, the P-type impurity region 16 provided immediately beneath the N-type collector region 151 in unnecessary.

Figure 15:
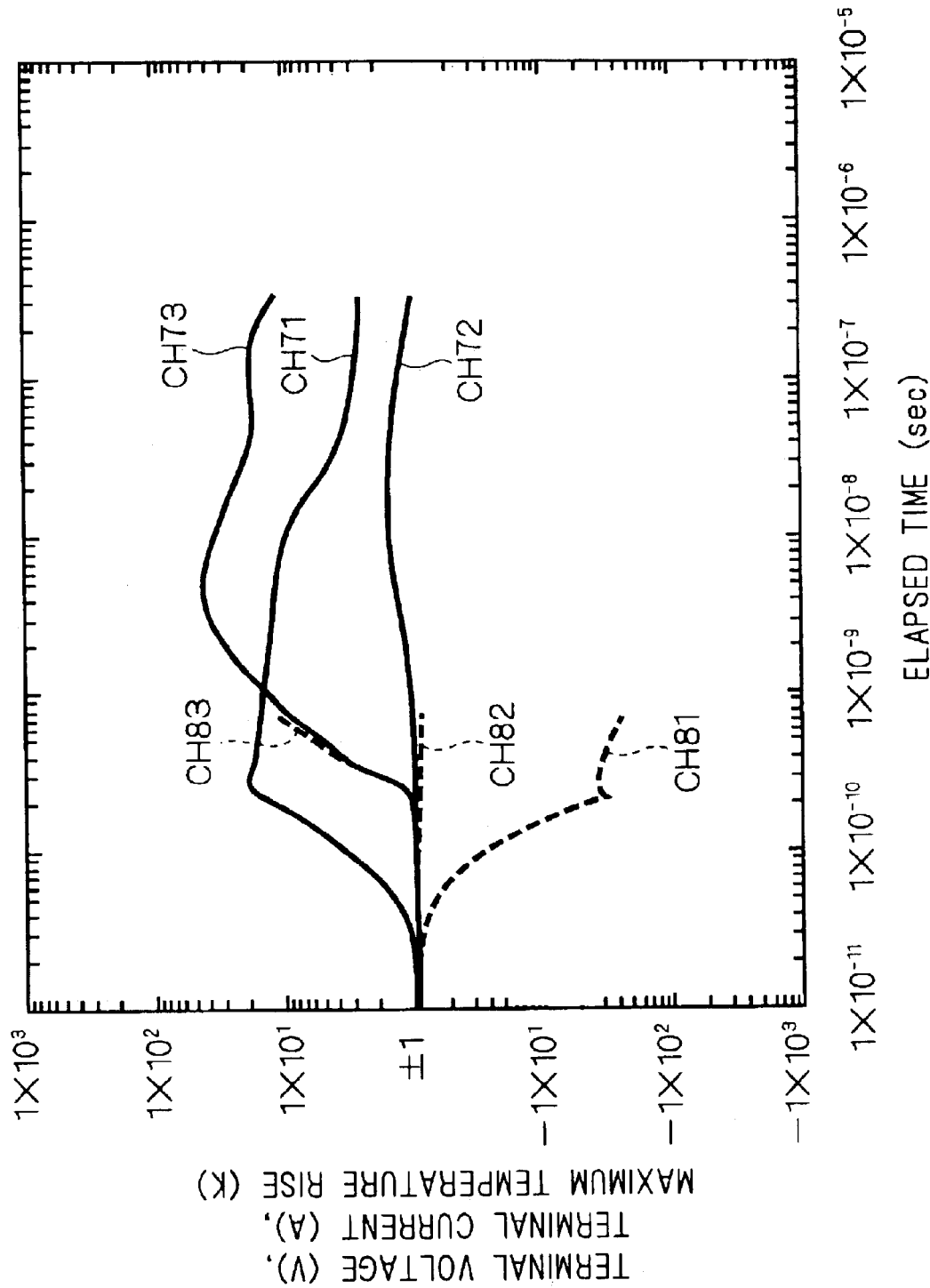
FIG. 15 is a graph explaining the operating characteristics of the first modification of the protecting element in accordance with the second embodiment of the present invention.

FIG. 15 shows device simulation result representing the response characteristics of the protecting element 200A in the case that an electrostatic discharge surge of 1 kV based on HBM is applied to the protecting element 200A according to which the above-described N-type collector region 151 is omitted.

In FIG. 15, the abscissa represents the elapsed time (sec) and the ordinate represents each of the terminal voltage (V), the terminal current (A) and the maximum temperature rise (K). The numerical values on the abscissa and the ordinate are shown according to the logarithmic expression. Regarding the terminal voltage (V), the terminal current (A) and the maximum temperature rise (K) on the ordinate, they have the center axis of ±1V, ±1A, and ±1K, respectively. The upper side of the center axis is positive values, while the lower side of the center axis is negative values.

In FIG. 15, the solid lines show various response characteristics of the protecting element 200A in the case that a positive bias is given to the input/output terminal PD11 with respect to the ground terminal GD11, i.e., when a positive surge voltage is applied to the protecting element 200A. On the other hand, the dotted lines show various response characteristics of the protecting element 200A in the case that a negative bias is given to the input/output terminal PD11 with respect to the ground terminal GD11, i.e., when a negative surge voltage is applied to the protecting element 200A. CH71, CH72 and CH73 respectively represent the characteristic curves of the terminal voltage, the terminal current and the maximum temperature rise under the condition that the positive surge voltage is applied to the protecting element 200A. CH81, CH82 and CH83 respectively represent the characteristic curves of the terminal voltage, the terminal current and the maximum temperature rise under the condition that the negative surge voltage is applied to the protecting element 200A.

As understood from FIG. 15, according to the protecting element 200A, when the positive surge voltage is applied, the terminal voltage greatly decreases at the elapsed time of 10 nsec and reaches to approximately 2V at the elapsed time of 100 nsec. Furthermore, the maximum temperature rise decreases down to approximately 40K with decreasing terminal voltage.

In the case that the negative surge voltage is applied, the terminal voltage exceeds −40V instantaneously. Thus, the simulation was terminated at this timing.

The reason why the terminal voltage shows such a large reduction is that, according to the arrangement missing the N-type collector region 151 of the pad side, hole injection easily occurs from the P-type base region 141 of the pad side to the low-concentration N-type impurity region 12. Thus, the thyristor action starts.

As described above, according to the protecting element 200A, the temperature rise can be further suppressed to a lower level. If the usage of this element is limited to a specific environment, for example, in which no negative surge voltage is applied. It is possible to further reduce the element area as a protecting element.

<B-5. Modified Embodiment 2>

Figure 16:
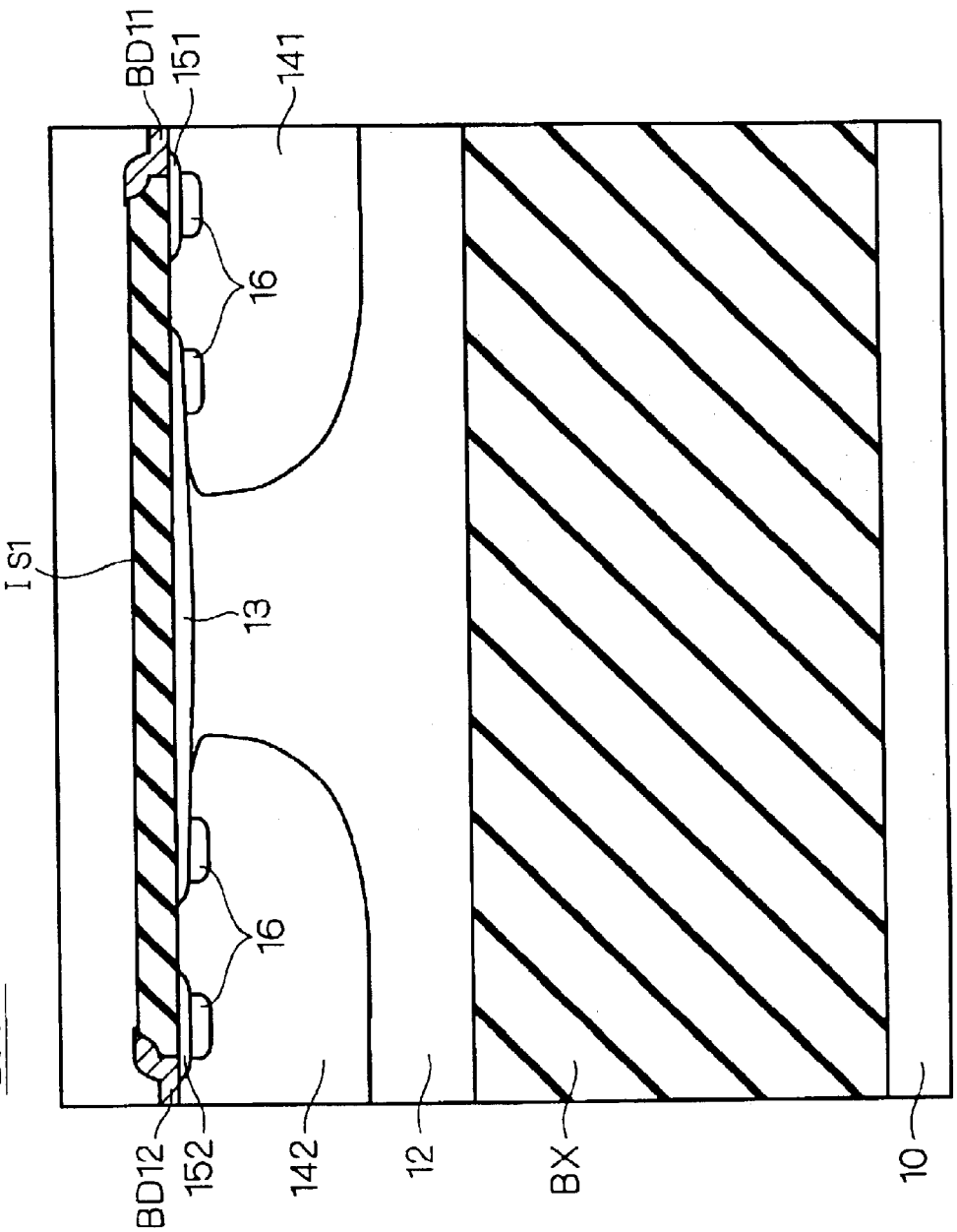
FIG. 16 is a cross-sectional diagram showing a second modification of the protecting element in accordance with the second embodiment of the present invention.

According to the cross-sectional arrangement of the protecting element 200 shown in FIG. 10, the high-concentration N-type impurity region 11 is provided on the P-type semiconductor substrate 10. However, the similar operation can be obtained even when a protecting element 200B shown in FIG. 16 is used. The protecting element 200B includes an embedded insulating layer BX, such as a silicon oxide film, instead of using the high-concentration N-type impurity region 11. Replacing the high-concentration N-type impurity region 11 with the embedded insulating layer BX makes it possible to apply the protecting element 200B to an SOI type element.

In FIG. 16, the members identical with those of the protecting element 200 shown in FIG. 10 are denoted by the same reference numerals. No duplicate explanation is given.

While the invention has been shown and described in detail, the foregoing description is in all aspects illustrative and not restrictive. It is therefore understood that numerous other modifications and variations can be devised without departing from the scope of the invention.

What is claimed is:

1. A semiconductor device interposed between an input/output terminal and a ground terminal of a semiconductor integrated circuit, and serving as a protecting element for protecting said semiconductor integrated circuit against electrostatic discharge, comprising:

first and second NPN transistors and a PNP transistor, wherein said first and second NPN transistors have emitters being commonly connected, said first NPN transistor has a collector and a base connected to said input/output terminal, and said second NPN transistor has a collector and a base connected to said ground terminal, and said PNP transistor has a base commonly connected to said emitters of said first and second NPN transistors, an emitter connected to said input/output terminal, and a collector connected to said ground terminal.

2. The semiconductor device according to claim 1, wherein said semiconductor device comprises:

a low-concentration N-type impurity region disposed in a surface of a first main surface of a semiconductor substrate and containing N-type impurities at a relatively lower concentration;

an N-type emitter region selectively disposed in a surface of said low-concentration N-type impurity region and containing N-type impurities at a relatively higher concentration;

first and second P-type base regions selectively disposed in a surface of said low-concentration N-type impurity region in such a manner that said N-type emitter region is located between said first and second P-type base regions and each of said first and second P-type base regions has a portion contacting with said N-type emitter region;

first and second N-type collector regions selectively disposed in respective surfaces of said first and second P-type base regions so as to be spaced from said N-type emitter region, and containing N-type impurities at a relatively higher concentration; and first and second base-collector common electrodes respectively contacting with portions of said first and second N-type collector regions exposed at the same level with exposed surfaces of said first and second P-type base regions, and also contacting partly with said exposed surfaces of said first and second P-type base regions, wherein said first base-collector common electrode is connected to said input/output terminal, said second base-collector common electrode is connected to said ground terminal, and said N-type emitter region corresponds to said emitters of said first and second NPN transistors and also corresponds to said base of said PNP transistor.

3. The semiconductor device according to claim 2, further comprising a plurality of P-type impurity regions selectively disposed in surfaces of portions in which both of said first and second P-type base regions contact with said N-type emitter region and form a P-N junction, respectively, and also selectively disposed in the surfaces of said first and second P-type base regions at portions corresponding to bottoms of said first and second N-type collector regions, and said P-type impurity regions containing P-type impurities at a lower concentration compared with said first and second P-type base regions.

4. The semiconductor device according to claim 2, further comprising a high-concentration N-type impurity region contacting with an entire surface of said low-concentration N-type impurity region at a second main surface side of said semiconductor substrate, and containing N-type impurities at a relatively higher concentration, wherein said high-concentration N-type impurity region is connected to a ground potential.

5. The semiconductor device according to claim 2, further comprising a high-concentration N-type impurity region contacting with a surface of said low-concentration N-type impurity region at a second main surface side of said semiconductor substrate, and containing N-type impurities at a relatively higher concentration, wherein said high-concentration N-type impurity region is maintained at a floating potential.

6. The semiconductor device according to claim 2, further comprising an insulating layer contacting with a surface of said low-concentration N-type impurity region at a second main surface side of said semiconductor substrate.

7. A semiconductor device interposed between an input/output terminal and a ground terminal of a semiconductor integrated circuit, and serving as a protecting element for protecting said semiconductor integrated circuit against electrostatic discharge, comprising:

an NPN transistor, a PNP transistor, and a diode, wherein an emitter of said NPN transistor, a base of said PNP transistor, and a cathode of said diode are commonly connected, an anode of said diode and an emitter of said PNP transistor are connected to said input/output terminal, a collector and a base of said NPN transistor are connected to said ground terminal, and a collector of said PNP transistor is connected to said ground terminal.

8. The semiconductor device according to claim 7, wherein said semiconductor device comprises:

a low-concentration N-type impurity region disposed in a surface of a first main surface of a semiconductor substrate, and containing N-type impurities at a relatively lower concentration;

an N-type emitter region selectively disposed in a surface of said low-concentration N-type impurity region, and containing N-type impurities at a relatively higher concentration;

first and second P-type base regions selectively disposed in a surface of said low-concentration N-type impurity region in such a manner that said N-type emitter region is located between said first and second P-type base regions and each of said first and second P-type base regions has a portion contacting with said N-type emitter region;

N-type collector regions selectively disposed in a surface of said second P-type base region so as to be spaced from said N-type emitter region, and containing N-type impurities at a relatively higher concentration;

a base-collector common electrode contacting with a portion of said N-type collector region exposed at the same level with an exposed surface of said second P-type base region, and also contacting partly with said exposed surface of said second P-type base region; and an anode-emitter common electrode contacting with an exposed surface of said first P-type base region, wherein said anode-emitter common electrode is connected to said input/output terminal, said base-collector common electrode is connected to said ground terminal, and said N-type emitter region corresponds to said emitter of said NPN transistor and also corresponds to said base of said PNP transistor.

9. The semiconductor device according to claim 8, further comprising a high-concentration N-type impurity region contacting with an entire surface of said low-concentration N-type impurity region at a second main surface side of said semiconductor substrate, and containing N-type impurities at a relatively higher concentration, wherein said high-concentration N-type impurity region is connected to a ground potential.

10. The semiconductor device according to claim 8, further comprising a high-concentration N-type impurity region contacting with a surface of said low-concentration N-type impurity region at a second main surface side of said semiconductor substrate, and containing N-type impurities at a relatively higher concentration, wherein said high-concentration N-type impurity region is maintained at a floating potential.

11. The semiconductor device according to claim 8, further comprising an insulating layer contacting with a surface of said low-concentration N-type impurity region at a second main surface side of said semiconductor substrate.

* * * * *